United States Patent
Walker et al.

(10) Patent No.: US 7,659,558 B1
(45) Date of Patent: Feb. 9, 2010

(54) SILICON CONTROLLED RECTIFIER ELECTROSTATIC DISCHARGE CLAMP FOR A HIGH VOLTAGE LATERALLY DIFFUSED MOS TRANSISTOR

(75) Inventors: Andrew J. Walker, Mountain View, CA (US); Helmut Puchner, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 463 days.

(21) Appl. No.: 11/233,959

(22) Filed: Sep. 23, 2005

(51) Int. Cl.
*H01L 21/84* (2006.01)
(52) U.S. Cl. .............. 257/173; 257/355; 257/E29.181
(58) Field of Classification Search .............. 257/173, 257/355, E29.181
See application file for complete search history.

(56) References Cited

U.S. PATENT DOCUMENTS

| | | | |
|---|---|---|---|
| 4,990,802 A | 2/1991 | Smooha | |
| 5,019,888 A | 5/1991 | Scott et al. | |
| 5,043,782 A | 8/1991 | Avery | |
| 5,140,401 A | 8/1992 | Ker et al. | |
| 5,157,573 A | 10/1992 | Lee et al. | |
| 5,173,755 A | 12/1992 | Co | |
| 5,182,220 A | 1/1993 | Ker et al. | |
| 5,218,222 A | 6/1993 | Roberts | |
| 5,237,395 A | 8/1993 | Lee | |
| 5,264,723 A | 11/1993 | Strauss | |
| 5,289,334 A | 2/1994 | Ker et al. | |
| 5,329,143 A | 7/1994 | Chan et al. | |
| 5,444,400 A | 8/1995 | Hall | |
| 5,576,557 A | 11/1996 | Ker et al. | |
| 5,591,992 A | 1/1997 | Leach | |
| 5,602,404 A | 2/1997 | Chen | |
| 5,625,522 A | 4/1997 | Watt | |
| 5,640,299 A | 6/1997 | Leach | |
| 5,670,799 A | 9/1997 | Croft | |
| 5,671,111 A | 9/1997 | Chen | |
| 5,675,469 A | 10/1997 | Racino et al. | |
| 5,682,047 A | 10/1997 | Consiglio et al. | |
| 5,784,242 A | 7/1998 | Watt | |
| 5,825,600 A * | 10/1998 | Watt ......................... | 361/56 |
| 6,281,527 B1 * | 8/2001 | Chen ......................... | 257/168 |
| 6,538,266 B2 * | 3/2003 | Lee et al. .................. | 257/173 |
| 6,548,874 B1 * | 4/2003 | Morton et al. ............. | 257/371 |

(Continued)

OTHER PUBLICATIONS

Duvvury et al., "Device Integration for ESD Robustness of High Voltage Power MOSFETs," © 1994 IEEE, 4 pgs.

(Continued)

*Primary Examiner*—Eugene Lee

(57) ABSTRACT

Devices for protecting drain extended metal oxide semiconductor (DEMOS) output transistors from damage caused by electrostatic discharge (ESD) events are provided. In general, the devices include a silicon controlled rectifier (SCR) and a DEMOS transistor configured to breakdown at a lower voltage than a breakdown voltage of the output driver transistor it is configured to protect. The devices further include a pair of ohmic regions configured to trigger the SCR upon breakdown of the drain contact region of the DEMOS transistor and a collection region configured to collect charge generated by the SCR. The transistor, the pair of ohmic regions, and the SCR are respectively configured and arranged to independently set the breakdown voltage of the drain contact region, the trigger voltage of the SCR, and the holding voltage of the SCR. One of the ohmic regions may be coupled to the drain contact region of the transistor.

20 Claims, 2 Drawing Sheets

U.S. PATENT DOCUMENTS

| | | | |
|---|---|---|---|
| 6,642,088 B1 * | 11/2003 | Yu | 438/155 |
| 7,202,114 B2 * | 4/2007 | Salcedo et al. | 438/133 |
| 7,375,398 B2 * | 5/2008 | Wang et al. | 257/355 |
| 2005/0275029 A1 * | 12/2005 | Watt | 257/355 |

OTHER PUBLICATIONS

Lee et al., "Novel ESD Protection Structure with Embedded SCR LDMOS for Smart Power Technology," 40th Annual International Reliability Physics Symposium, 2002, pp. 156-161.

U.S. Appl. No. 08/845,302 (PM96063): "Fast Turn-on Silicon Controlled Rectifier (SCR) for Electrostatic Discharge (ESD) Protection," Jeffrey Watt, filed on Apr. 25, 1997; 36 pages.

USPTO Notice of Allowance for U.S. Appl. No. 08/845,302 (PM96063) dated May 19, 1998: 2 pages.

USPTO Non-Final Rejection for U.S. Appl. No. 08/845,302 (PM96063) dated Feb. 6, 1998; 9 pages.

Duvvury et al., "ESD Phenomena and Protection Issues in CMOS Output Buffers," 1987; pp. 174-180; 4 pages.

Duvvury et al., "Internal Chip ESD Phenomena Beyond the Protection Circuit," 1988; pp. 2133-2138; 6 pages.

Polgreen et al., "Improving the ESD Failure Threshold of Silicided nMOS Output Transistors by Ensuring Uniform Current Flow," 1989; pp. 167-174; 8 pages.

Duvvury et al., "Achieving Uniform nMOS Device Power Distribution for Sub-micron ESD Reliability," 1992; 92-131 through 92-134; 4 pages.

Steven H. Voldman, "ESD Protection in a Mixed Voltage Interface and Multi-Rail Disconnected Power Grid Environment in 0.50- and 0.25-um Channel Length CMOS Technologies," 1995; 94-125 through 94-134: 10 pages.

Dabral et al., "Core Claps for Low Voltage Technologies," 1994; 94-141 through 94-149; 9 pages.

Voldman et al., "Mixed-Voltage Interface ESD Protection Circuits for Advance Microprocessors in Shallow Trench and LOCOS Isolation CMOS Technologies," 1994; 94-277 through 94-280; 4 pages.

Jaffe et al., "Electrostatic Discharge Protection in a 4-MBIT Dram," 1990; pp. 1-6; 6 pages.

LeBlanc et al., "Proximity Effects of 'Unused' Output Buffers on ESD Performance," 1991; pp. 327-330. 4 pages.

Worley et al., "Sub-Micron Chip ESD Protection Schemes which Avoid Avalanching Junction," 1995; 95-13 through 95-20; 8 pages.

Chatterjee et al., "A Low-Voltage Triggering SCR for On-Chip ESD Protection at Output and Input Pads," 1991; pp. 21-22; 2 pages.

USPTO Notice of Allowance for U.S. Appl. No. 08/297,629 (PM94020) dated Oct. 28, 1996; 8 pages.

USPTO Final Rejection for U.S. Appl. No. 08/297,629 (PM94020) dated Jun. 10, 1996; 6 pages.

USPTO Non-Final Rejection for U.S. Appl. No. 08/297,629 (PM94020) dated Sep. 12, 1995; 8 pages.

USPTO Notice of Allowance for U.S. Appl. No. 08/758,336 (PM94020C) dated Dec. 4, 1997; 2 pages.

USPTO Non-Final Rejection for U.S. Appl. No. 08/758,336 (PM94020C) dated Aug. 13, 1997; 6 pages.

Tandan, "ESD Trigger Circuit," EOS/ESD Symposium 1994, pp. 94-120 through 94-124, 5 pages.

Merrill et al., "ESD Design Methodology," EOS/ESD Symposium 1993, pp. 93-233 through 93-237; 5 pages.

van Roozendaal et al., "Standard ESD Testing of Integrated Circuits," 1990 EOS/ESD Symposium Proceedings, pp. 119-130; 12 pages.

Watt et al., "A Hot-Carrier Trigger SCR for Smart Power Bus ESD Protection," Cypress Semiconductor Corporation, 1995 IEEE Electron Device Letters, vol. 12, No. 1, Jan. 1991; 4 pages.

* cited by examiner

SILICON CONTROLLED RECTIFIER ELECTROSTATIC DISCHARGE CLAMP FOR A HIGH VOLTAGE LATERALLY DIFFUSED MOS TRANSISTOR

BACKGROUND OF THE INVENTION

1. Field of the Invention

The present invention relates generally to devices and circuits providing electrostatic discharge (ESD) protection, and more particularly, to devices and circuits providing ESD protection to high voltage laterally diffused metal oxide semiconductor (LDMOS) transistors.

2. Description of the Related Art

The following descriptions and examples are given as background information only.

As is well known in the microelectronics industry, integrated circuit devices are susceptible to damage from application of excessive voltages, such as, for example, electrostatic discharge (ESD) events. In particular, during an ESD event, charge transferred within a circuit can develop voltages that are large enough to break down insulating films (e.g., gate oxides) on the device or dissipate sufficient energy to cause electro-thermal failures in the device. Such failures include contact spiking, silicon melting, or metal interconnect melting. As such, protection circuits are often connected to I/O bonding pads of an integrated circuit to safely dissipate energy associated with ESD events away from active circuitry. Protection circuits may also be connected to power supply pads or between power supply buses to prevent damage to active circuitry. In developing effective ESD protection circuitry, circuit designers may, however, be limited with regard to the particular structures used, since the protection circuit must integrate well with the remainder of the integrated circuit. For instance, integrated circuits which operate with applications of high voltages (i.e., $V_{DD}$>12 volts) generally need protection circuitry configured to accommodate high voltage levels.

A transistor structure often used for high voltage applications is a drain extended metal oxide semiconductor (DEMOS) transistor, which may also be referred to in the microelectronics industry as a laterally diffused metal oxide semiconductor (LDMOS) transistor. DEMOS transistors differ from other MOS transistors in that the drain contact region is laterally displaced apart from the channel of the transistor at a greater distance than the source contact region of the transistor. As a consequence of the additional voltage drop in the drain extension region, the voltage across the channel of the DEMOS transistor is lower than a transistor having a drain contact region closer to the transistor gate and, in turn, the electric field across the gate oxide is lower. Although DEMOS transistors are effective for operations at high voltage levels, DEMOS transistors are inherently susceptible to damage from ESD events due to their device structure.

One approach in providing ESD protection for integrated circuits having DEMOS transistors is to employ a silicon controlled rectifier (SCR) type structure for transferring charge away from the transistor. For example, some conventional designs incorporate SCRs within active DEMOS transistors of an integrated circuit (i.e., transistors used for operations of a device other than protection from ESD events). Such a configuration, however, relies on drain breakdown of the active DEMOS transistor to trigger the SCR. In some cases, triggering the SCR in such a manner may not be fast enough to prevent the active DEMOS transistor from being damaged and, therefore, may not be effective for many applications. In other embodiments, an SCR may be incorporated within protection circuitry coupled to I/O bonding pads of an integrated circuit. In some cases, a protection-designated DEMOS transistor may further be included in the protection circuitry to trigger the SCR. In general, however, such configurations have limited controllability of the trigger and holding voltages of the SCR, specifically relative the breakdown voltage of the DEMOS transistor within the protection circuitry. More specifically, conventional designs do not offer layouts in which trigger and holding voltages of the SCR as well as the breakdown of the protection circuitry DEMOS transistor can be independently set. As a consequence, the level of ESD protection offered by such prior art designs is limited.

Accordingly, it would be beneficial to develop an improved ESD protection circuit suitable for use with an integrated circuit utilizing high voltage drain extended MOS transistors. In particular, it would be advantageous to develop an ESD protection device that allows the trigger and holding voltages of an incorporated SCR as well as the breakdown of an incorporated DEMOS transistor to be independently set. In addition, it would be valuable to arrange such protection circuitry in a variety of manners within an integrated circuit such that energy associated with ESD events may be safely dissipated from different types of circuit devices, including but not limited to pull down output transistors and/or pull up output transistors.

SUMMARY OF THE INVENTION

The problems outlined above may be in large part addressed by a circuit providing ESD protection to high voltage laterally diffused metal oxide semiconductor (LDMOS) transistors. The following are mere exemplary embodiments of the circuit and are not to be construed in any way to limit the subject matter of the claims.

One embodiment of the circuit includes a silicon controlled rectifier (SCR), a transistor coupled to the SCR and comprising an extended drain contact region, a pair of ohmic regions configured to trigger the SCR upon breakdown of the drain contact region, and a collection region configured to collect charge generated by the SCR. The transistor, the pair of ohmic regions, and the SCR are respectively configured and arranged to independently set the breakdown voltage of the drain contact region, the trigger voltage of the SCR, and the holding voltage of the SCR.

Another embodiment of the circuit includes a transistor with a drain contact region spaced from a sidewall of a gate of the transistor, a silicon controlled rectifier (SCR) comprising a cathodic region dually serving as a source contact region of the transistor, a pair of ohmic regions distinct from the SCR, and a charge collection region coupled to the gate and the source contact region of the transistor. One of the ohmic regions is coupled to the drain contact region of the transistor and the other of the ohmic regions is coupled to an anodic region of the SCR.

Another embodiment of the circuit includes a laterally diffused output driver transistor and a distinct device configured to provide electrostatic discharge protection for the laterally diffused output driver transistor. The distinct device includes a drain extended metal oxide semiconductor field effect transistor (DEMOS transistor) configured to breakdown at a lower voltage than a breakdown voltage of the laterally diffused output driver transistor and a silicon controlled rectifier (SCR) coupled to a source contact region of the DEMOS transistor. In addition, the distinct device includes a pair of impedance elements configured to forward bias an anodic region of the SCR upon breakdown of the DEMOS transistor and a region configured to collect charge generated from the SCR.

BRIEF DESCRIPTION OF THE DRAWINGS

These and various other features and advantages of the present invention will be apparent upon reading of the following detailed description in conjunction with the accompanying drawings and the appended claims provided below, where:

Figure 1:
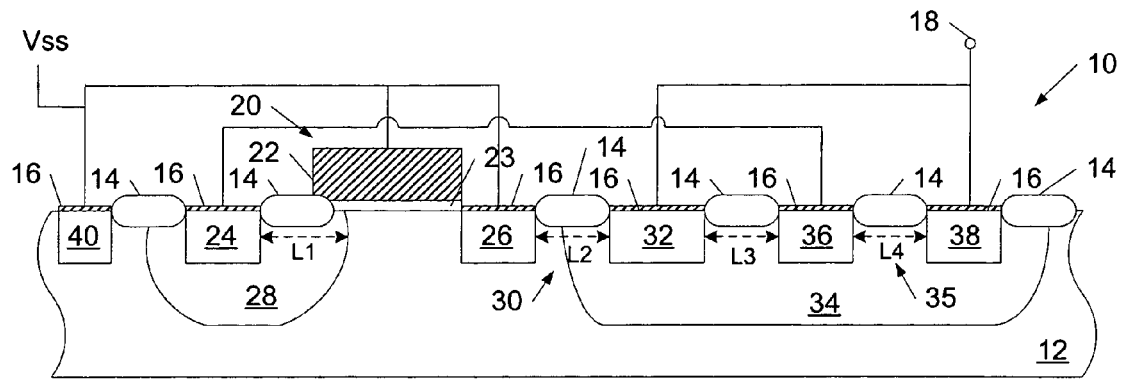
FIG. 1 is an exemplary cross-sectional view of a semiconductor structure configured to provide protection from electrostatic discharge (ESD)

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 4:
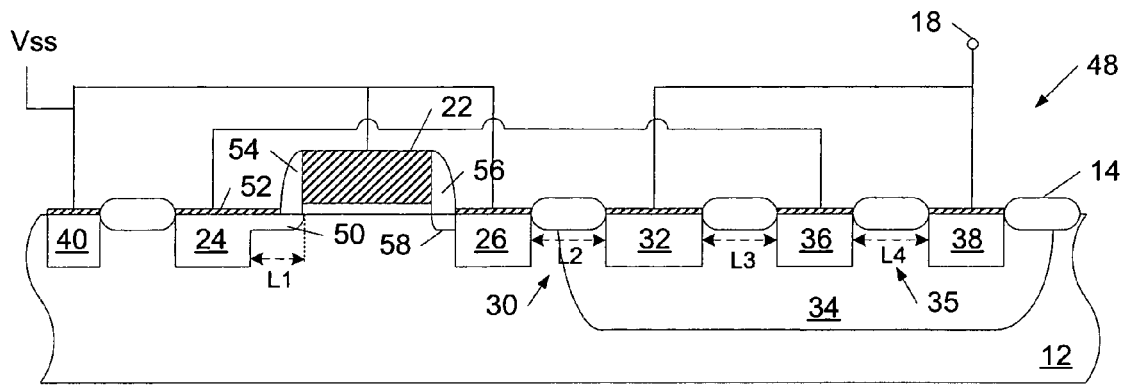
FIG. 4 is an exemplary cross-sectional view of yet another alternative semiconductor structure configured to provide ESD protection.
Figure 5:
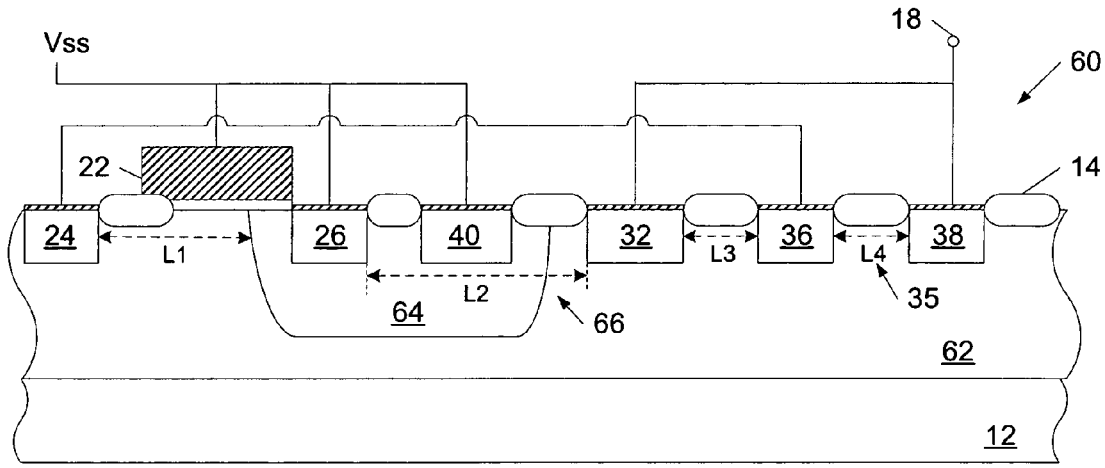
FIG. 5 is an exemplary cross-sectional view of yet another alternative semiconductor structure configured to provide ESD protection.
Figure 6:
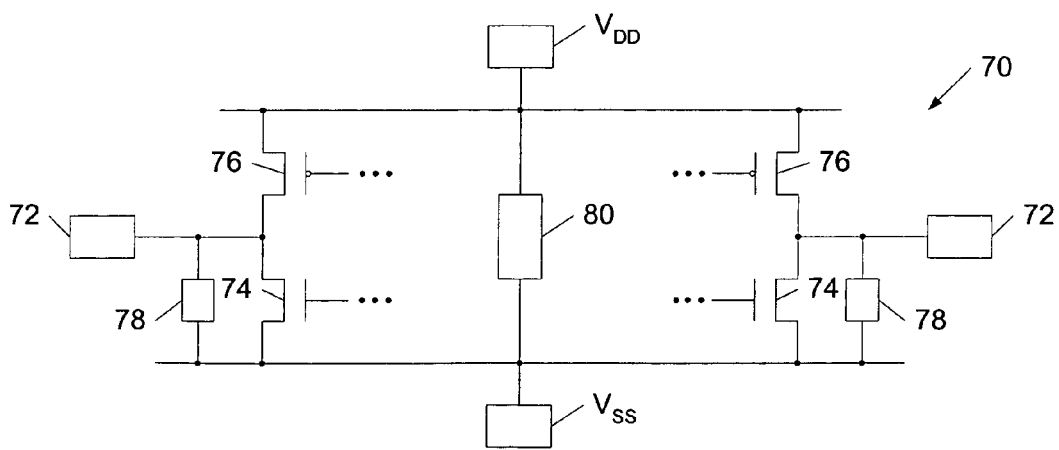
FIG. 6 is a schematic of an exemplary circuit depicting an arrangement of one or more of the semiconductor structures depicted in FIGS. 1-5 in positions relative to output driver transistors, signal pads, and power supply pads of the circuit.

Turning to the drawings, exemplary devices for protecting drain extended metal oxide semiconductor (DEMOS) output transistors from damage caused by electrostatic discharge (ESD) events are illustrated in FIGS. 1-5. More specifically, cross-sectional views of exemplary semiconductor topographies, which are configured to divert charge from a bus coupled to an active DEMOS output transistor, are shown in FIGS. 1-5. In addition, FIG. 6 illustrates a schematic of an exemplary circuit detailing an arrangement of one or more of the semiconductor topographies depicted in FIGS. 1-5 in positions relative to output driver transistors, signal pads, and power supply pads of the circuit. As discussed in reference to FIG. 6, the ESD protection devices described herein are distinct from the active DEMOS output transistors they are used to protect and, as such, the protection devices do not rely on the operation or, more specifically, the avalanche of the active DEMOS output transistors.

As noted above, a DEMOS transistor (i.e., whether used as an active transistor or as protection circuitry) is a MOS transistor having a drain contact region that is laterally displaced apart from the gate of the transistor at a greater distance than the source contact region is relative to an opposing side of gate. Such a configuration may be implemented in a variety of manners, some examples of which are shown and described below in reference to FIGS. 1-5. In some cases, a transistor with an extended drain contact region configuration may be alternatively referenced as a laterally diffused MOS transistor (LDMOS) and, as such, the terms DEMOS and LDMOS are used interchangeably herein. It is noted that the components illustrated in FIGS. 1-6 are not necessarily drawn to scale. Rather, FIGS. 1-6 are used to emphasize the relative arrangement and connections between components to provide an ESD protection circuit for an active DEMOS transistor.

FIG. 1 illustrates a cross-sectional view of ESD protection device 10 including DEMOS transistor 20, silicon controlled rectifier (SCR) 30, impedance device 35 and collection region 40. As will be described in more detail below, such components are collectively configured and arranged to transfer charge from a bus coupled to node 18 to a bus coupled to low power supply Vss. The bus coupled to node 18 is coupled to an active DEMOS output transistor of an integrated circuit (i.e., a DEMOS output transistor distinct from DEMOS transistor 20 and used for operation of an integrated circuit other than for ESD protection). As such, diverting charge from the bus coupled to node 18 will prevent excessive charge from accessing the active DEMOS output transistor.

As shown in FIG. 1, DEMOS transistor 20 includes gate 22 and gate oxide 23 disposed above semiconductor layer 12. The materials and dimensional characteristics of gate 22, gate oxide 23, and semiconductor layer 12 may include any of those known in the semiconductor fabrication industry for DEMOS transistors. For instance, semiconductor layer 12 may be a relatively lightly doped substrate or epitaxial layer (i.e., doped with a relatively light net concentration of electrically active p-type impurities or n-type impurities) and, thus, may have a relatively low degree of conductivity. For example, a doping level of semiconductor layer 12 may be generally less than or equal to approximately $1.0 \times 10^{19}$ cm$^{-3}$, more specifically between approximately $1.0 \times 10^{13}$ cm$^{-3}$ and approximately $1.0 \times 10^{17}$ cm$^{-3}$, and in some embodiments between about $1.0 \times 10^{14}$ cm$^{-3}$ and about $1.0 \times 10^{16}$ cm$^{-3}$.

As shown in FIG. 1, DEMOS transistor 20 further includes drain contact region 24 and source contact region 26 disposed within semiconductor layer 12 on opposing sides of gate 22. As used herein, the terms "drain contact region" and "source contact region" may generally refer to the diffusion regions within the semiconductor substrate at which contact is made to allow current flow to and from the transistor. In some embodiments, cladding layer 16 may be formed over such regions, as well as over other ohmic contact regions of ESD protection device 10, to improve the electrical conductivity of connections thereto. Due to the specific reference of contact being made to the regions, the terms "drain contact region" and "source contact region" do not generally include lighter doped shallow regions which are sometimes interposed between drain and source contact regions and respective sidewalls of the gate to reduce hot carrier effects of the gate dielectric. Rather, such lighter doped shallow regions are generally protected from contact by overlying spacer structures aligned with the sidewalls of the gate. It is noted that any of the configurations of DEMOS transistors described herein may include sidewall spacers and/or lightly doped shallow regions extending from gate sidewalls and, consequently, the ESD devices described herein are not necessarily limited to the illustrations of FIGS. 1-5. For instance, ESD protection device 10 may, in some embodiments, include sidewall spacers and/or lightly doped shallow regions extending from the sidewalls of gate 22 with respect to either or both of drain and source contact regions 24 and 26.

In any case, drain contact region 24 and source contact region 26 may each include a net concentration of electrically active dopants opposite in conductivity type to semiconductor layer 12. In other embodiments, drain contact region 24 and source contact region 26 may be of the same conductivity type as semiconductor layer 12, but may be disposed within a well region of opposite conductivity type. In such cases, drain contact region 24 may be further disposed within well region 28 as described in reference to FIGS. 1-3. In yet other embodiments, drain contact region 24 and source contact region 26 may be formed within an epitaxial layer arranged upon semiconductor layer 12 with the epitaxial layer of the same conductivity type as regions 24 and 26 and of opposite conductivity type as semiconductor layer 12. In such cases, source contact region 26 is further formed within a well region of opposite conductivity type to the epitaxial layer. An example of such a configuration is shown in FIG. 5 and described in more detail below.

In any case, drain contact region 24 may be laterally displaced away from gate 22 at a farther distance than source contact region 26 from gate 22 such that a DEMOS transistor is formed. In some embodiments, drain contact region 24 may be spaced apart from gate 22 by field oxide isolation structure 14 as shown in FIG. 1. In other embodiments, field oxide isolation structure 14 may be omitted from ESD protection device 10 and an alternative technique for displacing drain contact region 24 from gate 22 may be used. Other displacement techniques which may be employed include the use of sidewall spacers or other structures along gate 22 as noted in the alternative embodiments of FIGS. 3 and 4. In yet other embodiments, a temporary masking layer may be placed adjacent to gate 22 and dopants may be implanted into the semiconductor topography such that drain contact region 24 is formed in a designated position relative to gate 22.

In some cases, drain contact region 24 may be disposed within a lightly-doped well region of the same conductivity type as the drain contact region, such as noted by well region 28 in FIG. 1. The increased drain-to-substrate junction area provided by well region 28, along with the reduced dopant concentration at the drain-to-substrate junction, greatly increases the junction breakdown voltage, permitting higher voltage operation of the transistor. In particular, well region 28 may be fabricated to extend from beneath a portion of gate 22 to an isolation region disposed on the outlying side of drain contact region 24 such that drain contact region 24 is enveloped therein. In addition, well region 28 may have a doping level less than drain contact region 24, such as between approximately $1.0 \times 10^{16}$ and approximately $5.0 \times 10^{18}$ cm$^{-3}$, more specifically between approximately $5.0 \times 10^{16}$ and approximately $1.0 \times 10^{18}$ cm$^{-3}$, and in some embodiments around $2.0 \times 10^{17}$ cm$^{-3}$. In contrast, drain contact region 24, as well as source contact region 26, may having a doping level between approximately $1.0 \times 10^{19}$ and approximately $1.0 \times 10^{21}$ cm$^{-3}$, more specifically between approximately $1.0 \times 10^{20}$ and approximately $1.0 \times 10^{21}$ cm$^{-3}$, and in some embodiments around $1.0 \times 10^{20}$ cm$^{-3}$.

In general, the breakdown voltage of drain contact region 24 may correspond to the distance the drain contact region is displaced from the channel region beneath gate 22, denoted in FIG. 1 as L1. Consequently, with the incorporation of well region 28 and, in some cases, field oxide isolation structure 14, the breakdown voltage of drain contact region 24 may be set and, in some embodiments, optimized for the operation of ESD device 10. In other cases, well region 28 may be omitted from DEMOS transistor 20. Exemplary configurations of DEMOS transistors without a well region enveloped around drain contact region 24 are shown and described in reference to FIGS. 4 and 5. In such cases, the distance L1 correlating to the breakdown of the DEMOS transistor may be defined by the distance between drain contact region 24 and the edge of the channel of DEMOS transistor 20. In any case, as discussed in more detail below, the distance L1 may be advantageously set independent of the holding and triggering voltages of SCR 30 and, as such, the applicability of the ESD protection devices described herein relative to conventional devices may be increased. In some embodiments, it may be advantageous to configure the breakdown of DEMOS transistor 20 at a lower voltage than a breakdown voltage of the active DEMOS output transistor ESD protection device 10 is configured to protect. In this manner, ESD protection device 10 may divert the excessive voltage on a bus coupled to the active DEMOS output transistor prior to the active transistor breaking down. As a result, damage to the active DEMOS output transistor due to ESD events may be prevented.

As noted above, DEMOS transistors are generally used for operations employing high voltages. In reference to such transistors, the term "high voltage" may generally refer to voltages exceeding approximately 12 volts. As such, DEMOS transistor 20 may generally be configured to breakdown at a voltage exceeding approximately 12 volts and less than the breakdown voltage of the active DEMOS transistor being protected. Many active DEMOS output transistors used in current applications employ an operating range between approximately 36 volts and approximately 40 volts and breakdown voltage between approximately 60 volts and approximately 65 volts. As such, DEMOS transistor 20 may, in some embodiments, be specifically configured to breakdown between approximately 40 volts and approximately 56 volts and, more specifically, between approximately 44 volts and approximately 56 volts to accommodate such a common configuration of active DEMOS output transistors. Higher or lower breakdown voltages for DEMOS transistor 20, however, may be employed, depending on the design specifications of the active DEMOS output transistor being protected.

An exemplary distance range for L1 to accommodate the breakdown voltages of DEMOS transistor 20 may be between approximately 0.5 micron and approximately 10 microns, depending on the dimensional specifications of gate 22 and gate oxide 23 as well as the doping specifications of drain and source contact regions 24 and 26, well region 28, and semiconductor layer 12. In some embodiments, distances between approximately 1.0 micron and approximately 3.0 microns, or more specifically, around 1.5 microns may be particularly applicable for L1. Longer or shorter distances for L1, however, may be employed, depending on the design specifications of the device.

Adjacent to source contact region 26, ESD protection device 10 includes well region 34 of the same conductivity type and as well region 28. Well region 34 includes ohmic contact regions 32, 36, and 38 dielectrically spaced from each other and from source contact region 26 by field oxide isolation structures 14. As with drain contact region 24 and source contact region 26, one or more of ohmic contact regions 32, 36, and 38 may include cladding layer 16 thereon to reduce resistance of the connections to the respective power supplies and busses. Ohmic contact regions 36 and 38 are of the same conductivity type as drain and source contact regions 24 and 26, while ohmic contact region 32 is of the opposite conductivity type.

Due to the arrangement of ohmic contact region 32 and well region 34, a pnpn junction is formed among ohmic contact region 32, well region 34, semiconductor layer 12, and source contact region 26. More specifically, a first bipolar transistor (either npn or pnp) is formed by source contact region 26 (emitter/collector), semiconductor layer 12 (base), and well region 34 (collector/emitter). In addition, a second bipolar transistor (either pnp or npn) is formed by ohmic contact region 32 (emitter/collector), well region 34 (base), and semiconductor layer 12 (collector/emitter). Collectively, the bipolar transistors serve as silicon controlled rectifier (SCR) 30. In particular, source contact region 26 and ohmic contact region 32 may serve as cathodes and anodes of SCR 30, respectively or vice versa, depending on the conductivity types of the regions formed within ESD protection device 10. The distance between source contact region 26 and ohmic contact region 32, denoted in FIG. 1 as L2, determines the holding voltage of SCR 30 and, consequently, may be set by the width of the isolation structure therebetween. The relative operation of SCR 30 to DEMOS transistor 20 and other components within ESD protection device 10 is described in more detail below.

In general, well region 34 may have a relatively light concentration of electrically active dopants as compared to ohmic contact regions 36 and 38 such that the composite of such regions innately function as a resistor, denoted in FIG. 1 as impedance element 35. In particular, well region 34 may include a concentration level within the range described above for well region 28 and ohmic contact regions 36 and 38 may include a concentration level with the range described above for source and drain contact regions 24 and 26. The relative operation of impedance element 35 to SCR 30 and DEMOS transistor 20 is described in more detail below, but may generally be used to trigger SCR 30 (i.e., forward bias ohmic contact region 32 to inject charge into semiconductor layer 12) upon avalanche of contact region 24 of DEMOS transistor 20. The distances between ohmic contact regions 32, 36, and 38, denoted in FIG. 1 as L3 and L4, determine the triggering voltage of SCR 30 and, consequently, may be set by the width of the isolation structures therebetween. As such, the breakdown voltage of drain contact region 24, the trigger voltage of SCR 30, and the holding voltage of SCR 30 may be set independently.

It is noted that although field oxide isolation structures 14 are shown in FIG. 1 having substantially equal widths, ESD protection device 10 is not necessarily so limited. In particular, each of the field oxide isolation structures 14 may be independently optimized for the operation of ESD protection device 10 and, therefore, one of more of them may differ in size in some embodiments. As with L1, exemplary distance ranges for L2, L3 and L4 may be between approximately 0.5 micron and approximately 10 microns, depending on the dimensional and doping specifications of ohmic contact regions 32, 36, and 38 and semiconductor layer 12. In some embodiments, distances between approximately 1.0 micron and approximately 3.0 microns, or more specifically, around 1.5 microns may be particularly applicable for L2, L3, and L4. Longer or shorter distances for L2, L3, and L4, however, may be employed, depending on the design specifications of the device.

The charge injected into semiconductor layer 12 from SCR 30 may be collected at collection region 40, which in turn is coupled to low power supply Vss to dissipate the charge. As with the other contact regions of ESD protection device 10, collection region 40 may, in some embodiments, include cladding layer 16 thereon to reduce resistance of the connections to Vss. Collection region 40 includes the same net conductivity type as ohmic contact region 32 and semiconductor layer 12. In order to generate charge from SCR 30 and pass it to collection region 40, ohmic contact region 32 and collection region 40 may generally be configured to have relatively high conductivity. For instance, ohmic contact region 32 and collection region 40 may include relatively similar or different dopant concentration levels between approximately $1.0 \times 10^{19}$ and approximately $1.0 \times 10^{21}$ cm$^{-3}$, more specifically between approximately $1.0 \times 10^{20}$ and approximately $1.0 \times 10^{21}$ cm$^3$, and in some cases about $1.0 \times 10^{20}$ cm$^{-3}$.

As shown in FIG. 1, source contact region 26, gate 22, and collection region 40 are coupled to low power supply Vss. In contrast, ohmic contact regions 32 and 38 are coupled to node 18, which in turn is coupled to a bus coupled to a high voltage signal pad or a high voltage power supply. In addition, drain contact region 24 is coupled to ohmic contact region 36. When an integrated circuit including ESD protection device 10 is powered-up, node 18 is essentially between 0 volts and $V_{DD}$ and SCR 30 is initially in a first, high-impedance "OFF" state. In the first state, any voltage that is applied to input pads of the integrated circuit in excess of the high voltage power supply $V_{DD}$ but below the threshold trigger level of DEMOS transistor 20, will not cause large leakage currents to be drawn through ESD protection device 10. Rather, such initial voltages will at most cause relatively small, transient currents to flow through active devices of the integrated circuit to charge the bus coupled to node 18 to a voltage level below the excessive voltage being applied. Subsequent applications of voltages higher than $V_{DD}$ will cause substantially no further input leakage currents to flow. Controlled application of voltages, even in excess of $V_{DD}$, to pins of the device in this context may be considered "normal." However, ESD events are not considered part of the "normal" operation of the device.

For a subsequent positive polarity ESD event on a high voltage signal pad with respect to Vss, the voltage on node 18 increases with respect to Vss. For voltages below the breakdown voltage of drain contact region 24, the voltage on drain contact region 24 is approximately equal to that on the bus. This approximation is fairly accurate since the current level being drawn from the bus is fairly low. When the voltage on the bus coupled to node 18 reaches the breakdown voltage of drain contact region 24, current begins to flow through well region 34 between ohmic contact region 38 and ohmic contact region 36 and injects charge (i.e., holes in embodiments in which ohmic contact regions 36 and 38 are n-type and electrons when ohmic contact regions 36 and 38 are p-type) into semiconductor layer 12. The charge injection into semiconductor layer 12 forward biases the source contact region 26, which in turn injects charges of opposite conductivity (i.e., electrons in embodiments in which source contact region 26 is n-type and holes when source contact region 26 is p-type) into drain contact region 24 and well region 34.

Simultaneous with the breakdown of drain contact region 24, the current flowing between ohmic contact regions 36 and 38 results in a voltage drop across well region 34, causing ohmic contact region 32 to become forward biased. Forward bias of ohmic contact region 32 results in an injection of charge (i.e., holes in embodiments in which ohmic contact region 32 is p-type and electrons when ohmic contact region 32 is n-type) into semiconductor layer 12. The injection of the charge from ohmic contact region 32 hastens the transition of SCR 30 into a latched state. Such a low-impedance "ON" state of SCR 30 is characterized by a voltage drop of approximately 7 volts between the bus coupled to node 18 and negative power supply bus Vss. Inasmuch as the injection of charge from ohmic contact region 32 is initiated, the time lag between the occurrence of an ESD event and when SCR 30 turns on becomes sufficiently short to effectively handle relatively fast ESD events, such as ESD events occurring according to the Charged Device Model (CDM), for example.

A similar operation of ESD protection device 10 may be employed for negative polarity ESD events on a high voltage signal pad with respect to $V_{DD}$, when the protection device is employed as a core clamp between high and low voltage power supplies of the integrated circuit. In particular, ESD protection device 10 may be employed to divert excessive current away from an active pull up DEMOS output transistor. In either application, SCR 30 will remain in the low-impedance state until current through either the bipolar transistors is interrupted. This interruption may occur when all of the charge from the ESD event is transferred from node 18 to Vss. Once the charge transfer is complete, SCR 30 returns to a high-impedance "OFF" state.

Figure 2:
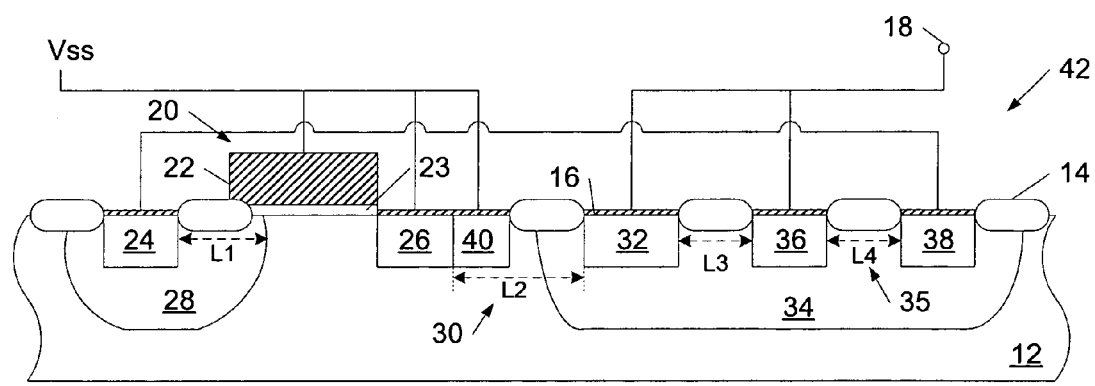
FIG. 2 is an exemplary cross-sectional view of alternative semiconductor structure configured to provide ESD protection.

Alternative configurations of ESD protection devices that are adapted to divert charge from a bus coupled to an active DEMOS output transistor are shown in FIGS. 2-5. For example, FIG. 2 illustrates ESD protection device 42 having the same components as ESD protection device 10 in FIG. 1 but slightly rearranged and a couple of connections switched. In particular, collection region 40 is moved to a region interposed between source contact region 26 and well region 34, rather than spaced adjacent to drain contact region contact as depicted in FIG. 1. Although collection region 40 is shown bordering source contact region 26 in FIG. 2, the placement of the region is not necessarily so limited. In particular, collection region 40 may alternatively be spaced apart from source contact region 26 by a portion of semiconductor layer 12 and, in some cases, may be spaced apart from source contact region 26 by a field oxide isolation structure.

In either configuration, the placement of collection region 40 in such a location may facilitate faster collection of charge generated by SCR 30. In addition, as noted in FIG. 2, distance L2, which determines the holding voltage of SCR 30 may be larger in such a configuration than in the configuration depicted in FIG. 1 and, consequently, the holding voltage of SCR 30 may be higher in ESD protection device 42 than ESD protection device 10. Another distinction between ESD protection devices 42 and 10 is drain contact region 24 is coupled to ohmic contact region 38 and ohmic contact region 36 is coupled to node 18. It is noted that such an alternative connection of components is not mutually exclusive to the alternative placement of collection region 40 included in ESD protection device 42 and, therefore, such a connection may be incorporated into ESD protection device 10 or other alternative embodiments of ESD protection devices described herein.

Figure 3:
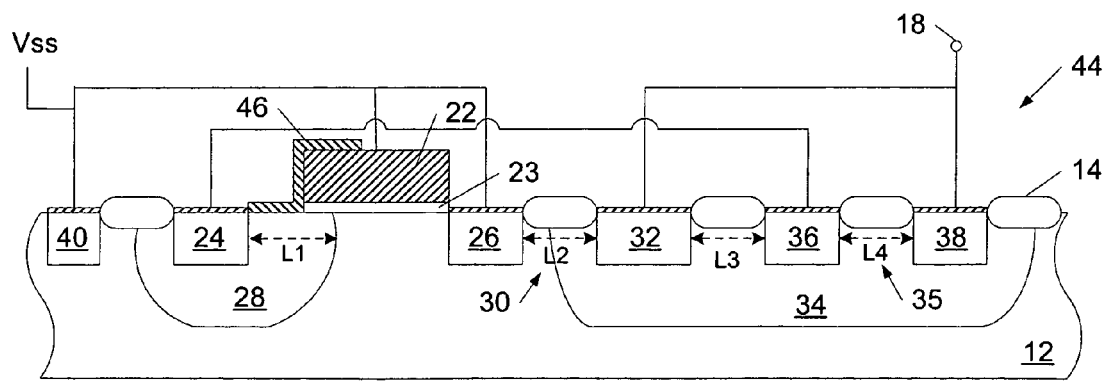
FIG. 3 is an exemplary cross-sectional view of another alternative semiconductor structure configured to provide ESD protection.

FIGS. 3-5 illustrate alternative configurations of drain extended MOS transistors which may be configured with a plurality of diffusion regions to form an ESD protection device having an SCR and an impedance element configured to trigger the SCR upon avalanche of the corresponding DEMOS transistor. As shown in FIGS. 3 and 4, ESD protection devices 44 and 48 may include many of the same components as ESD protection device 10 in FIG. 1. In particular, the components in FIGS. 3 and 4 having the same reference numbers as shown in FIG. 1 may be substantially similar and, therefore, the description of such components for ESD protection device 10 are referenced for ESD protection devices 44 and 48. ESD protection device 44 in FIG. 3 differs from ESD protection device 10 in FIG. 1 by the use of structure 46 along gate 22 and above a portion of well region 28 to extend drain contact region 24 apart from gate 22. Structure 46 includes a dielectric material, such as silicon dioxide or silicon nitride, and, in some embodiments, may be used to prevent the formation of silicide structures along gate 22.

ESD protection device 48 in FIG. 4 differs from ESD protection device 10 in FIG. 1 by the exclusion of well region 28 and, instead, includes lightly doped shallow region 50 and sidewall spacer 54. ESD protection device 48 further includes cladding layer 52 extending over drain contact region 24 and a portion of lightly doped shallow region 50 abut to sidewall spacer 54. Furthermore, ESD protection device 48 includes sidewall spacer 56 on the opposing side of gate 22 and also includes lightly doped shallow region 58 displacing source contact region 26 from gate 22. In some embodiments, lightly doped shallow regions 50 and 58 may include substantially similar concentrations. In other embodiments, however, lightly doped shallow region 50 may include a smaller net concentration of impurities than lightly doped shallow region 58. In yet other embodiments, any combination of the components described in reference to FIGS. 1-4 may be used to extend a drain contact region from a gate to form a DEMOS transistor. For example, both structure 46 and a lightly doped shallow region may be used to extend drain contact region 24 from gate 22. In other embodiments, spacer 54 and extended cladding layer 52 may be formed over drain contact region 24 while disposed within well 28.

FIG. 5 illustrates ESD protection device 60 including a different configuration of well regions and further illustrates the formation of such well regions as well as drain and source contact regions 24 and 26 of the DEMOS transistor 20 and ohmic contact regions 32, 36, 38 and 40 within a semiconductor layer of an opposite conductivity type than described in reference to FIGS. 1-4. In particular, FIG. 5 illustrates ESD protection device 60 including semiconductor layer 62 arranged above semiconductor layer 12 and doped of the same conductivity type as drain and source contact regions 24 and 26 as well as ohmic contact regions 36 and 38. In general, semiconductor layer 62 may include a doping concentration in the range described for well region 34. Well regions 28 and 34 have been omitted, but well region 64 is of the same conductivity type as collection region 40 and is shown surrounding source contact region 26 and collection region 40.

As a result, a pnpn junction is formed among source contact region 26, well region 64, semiconductor layer 62, and ohmic contact region 32. More specifically, a first bipolar transistor (either npn or pnp) is formed by source contact region 26 (emitter/collector), well region 64 (base), and semiconductor layer 62 (collector/emitter). In addition, a second bipolar transistor (either pnp or npn) is formed by ohmic contact region 32 (emitter/collector), semiconductor layer 62 (base), and well region 64 (collector/emitter). Collectively, the bipolar transistors serve as silicon controlled rectifier (SCR) 66. In particular, source contact region 26 and ohmic contact region 32 may serve as cathodes and anodes of SCR 66, respectively or vice versa, depending on the conductivity types of the regions formed within ESD protection device 60.

It is noted that each of the alternative configurations presented in FIGS. 2-5 allow the distances L1-L4 to be independently set and, thus, the breakdown voltage of drain contact region 24, the trigger voltage of the SCR incorporated therein, and the holding voltage of the SCR 30 may be set independently.

As noted above, the ESD protection devices described herein may be incorporated to protect either pull-up or pull-down DEMOS output transistors (i.e., pull-up or pull-down LDMOS output transistors). FIG. 6 illustrates a schematic of an exemplary circuit outlining the arrangement of one or more of the ESD protection devices described herein relative to output driver transistors, signal pads, and power supply pads of the circuit. In particular, FIG. 6 illustrates circuit 70 having ESD protection device 78 arranged in parallel with DEMOS pull down transistor 74. In such a configuration, a positive zap on high voltage signal pad 72 with respect to low power supply Vss will prompt ESD protection device 78 to trigger prior to DEMOS pull down transistor 74 and thus divert excessive voltage on the bus common to both devices. In addition, the inclusion of ESD protection device 80 along the bus between high voltage power supply VDD and low voltage power supply Vss may divert ESD current away from pull-down DEMOS transistor 76 when a negative zap on high voltage signal pad 72 with respect to high voltage power supply $V_{DD}$ occurs.

In general, ESD protection devices 78 and 80 may include any of the configurations described in reference to FIGS. 1-5. In some embodiments, ESD protection devices 78 and 80 may include the same configuration. In other embodiments, ESD protection devices 78 and 80 may include different configurations. In yet other embodiments, one of ESD protection devices 78 and 80 may be omitted from circuit 70. In such cases, alternative ESD protection devices may, in some embodiments, be incorporated onto the I/O signal pads of circuit 70. The continuation dots extending from pull down output DEMOS transistors 74 and pull up DEMOS transistors 76 indicate routings extending to circuitry internal to circuit 70.

It will be appreciated to those skilled in the art having the benefit of this disclosure that this invention is believed to provide devices for protecting drain extended metal oxide semiconductor (DEMOS) output transistors from damage caused by electrostatic discharge (ESD) events. Further modifications and alternative embodiments of various aspects of the invention will be apparent to those skilled in the art in view of this description. For example, although the devices are specifically discussed in reference to protection from ESD events, the devices may additionally or alternatively be used to protect against other excessive voltage events. It is intended that the following claims be interpreted to embrace all such modifications and changes and, accordingly, the drawings and the specification are to be regarded in an illustrative rather than a restrictive sense.

What is claimed is:

1. A device for providing electrostatic discharge (ESD) protection, comprising:
    a transistor comprising a drain contact region spaced from a sidewall of a gate of the transistor;
    a silicon controlled rectifier (SCR) comprising a cathodic region dually serving as a source contact region of the transistor;
    a pair of ohmic regions distinct from the SCR, wherein one of the ohmic regions is coupled to the drain contact region of the transistor and the other of the ohmic regions is coupled to an anodic region of the SCR; and
    a charge collection region coupled to the gate and the source contact region of the transistor, wherein the charge collection region is arranged adjacent to the source contact region.

2. The device of claim 1, wherein the pair of ohmic regions comprise a net concentration of impurities of a first conductivity type and are disposed within a first doped region comprising a comparatively lower net concentration of impurities of the first conductivity type such that current flow is induced within the first doped region upon avalanche of the drain contact region of the transistor.

3. The device of claim 2, wherein the anodic region is disposed within the first doped region such that the current flow induced by the pair of ohmic regions forward biases the anodic region to trigger current flow through the SCR.

4. The device of claim 3, wherein the cathodic region of the SCR and the charge collection region are disposed in a second doped region comprising a net concentration of impurities of opposite conductivity type than the first doped region such that charge generated by the SCR is injected into the second doped region and collected by the charge collection region.

5. The device of claim 1, wherein a distance between the drain contact region and most proximate edge of the gate sets the breakdown voltage of the drain contact region.

6. The device of claim 1, wherein the drain contact region is disposed within a well region of the same conductivity type as the drain contact region.

7. The device of claim 6, wherein the well region extends from beneath a portion of the gate to an isolation region disposed on the outlying side of the drain contact region.

8. The device of claim 6, wherein a distance between the drain contact region and an edge of the well region proximate to the gate sets the breakdown voltage of the drain contact region.

9. The device of claim 8, wherein the distance between the drain contact region and the edge of the well region proximate to the gate is between approximately 0.5 microns and approximately 10 microns.

10. The device of claim 8, wherein the distance between the drain contact region and the edge of the well region proximate to the gate is between approximately 1.0 microns and approximately 3.0 microns.

11. The device of claim 1, wherein the source contact region is disposed within a well region of opposite conductivity type as the source contact region.

12. The device of claim 11, wherein a distance between the drain contact region and most proximate edge of the well region sets the breakdown voltage of the drain contact region.

13. The device of claim 1, wherein a distance between the anodic region and the cathodic region sets the holding voltage of the SCR, and wherein a distance between the anodic region and the ohmic region closest to the anodic region at least partially sets the trigger voltage of the SCR.

14. The device of claim 13, wherein a distance between the pair of ohmic regions further sets the trigger voltage of the SCR.

15. The device of claim 1, wherein the transistor, the pair of ohmic regions, and the SCR are respectively configured and arranged to independently set the breakdown voltage of the drain contact region of the transistor, the trigger voltage of the SCR, and the holding voltage of the SCR.

16. The device of claim 1, wherein the transistor is configured to breakdown at a voltage greater than approximately 12 volts.

17. The device of claim 1, wherein the transistor is configured to breakdown at a voltage between approximately 40 volts and approximately 56 volts.

18. The device of claim 1, wherein the transistor is configured to breakdown at a voltage between approximately 44 volts and approximately 56 volts.

19. The device of claim 1, wherein the charge collection region borders the source contact region.

20. The device of claim 1, wherein the pair of ohmic regions, the anodic region of the SCR, and the drain contact region are disposed within an epitaxial layer of the same conductivity type as the drain contact region, and wherein the charge collection region and the source contact region are disposed within a well region of opposite conductivity type as the source contact region.

* * * * *